US011448615B2

(12) United States Patent
Zimmermann et al.

(10) Patent No.: US 11,448,615 B2
(45) Date of Patent: Sep. 20, 2022

(54) ION TRANSPORT DEVICE, ION MOBILITY SPECTROMETER, AND MASS SPECTROMETER (71) Applicant: GOTTFRIED WILHELM LEIBNIZ UNIVERSITÄT HANNOVER, Hannover (DE)

(72) Inventors: Stefan Zimmermann, Burgwedel (DE); Ansgar Kirk, Hannover (DE); Alexander Bohnhorst, Hannover (DE)

(73) Assignee: GOTTFRIED WILHELM LEIBNIZ UNIVERSITAET HANNOVER, Hannover (DE)

( * ) Notice: Subject to any disclaimer, the term of this patent is extended or adjusted under 35 U.S.C. 154(b) by 0 days.

(21) Appl. No.: 16/972,182

(22) PCT Filed: May 29, 2019

(86) PCT No.: PCT/EP2019/064029
 § 371 (c)(1),
 (2) Date: Dec. 4, 2020

(87) PCT Pub. No.: WO2019/233865
 PCT Pub. Date: Dec. 12, 2019

(65) Prior Publication Data
US 2021/0239651 A1 Aug. 5, 2021

(30) Foreign Application Priority Data

Jun. 5, 2018 (DE) ...................... 10 2018 113 331.6

(51) Int. Cl.
 G01N 27/62 (2021.01)
 H01J 49/02 (2006.01)
 (Continued)

(52) U.S. Cl.
 CPC .......... *G01N 27/622* (2013.01); *H01J 49/022* (2013.01); *H01J 49/025* (2013.01); *H01J 49/066* (2013.01)

(58) Field of Classification Search
 CPC .... G01N 27/622; H01J 49/022; H01J 49/025; H01J 49/066
 (Continued)

(56) References Cited

U.S. PATENT DOCUMENTS 6,316,768 B1   11/2001  Rockwood et al.
2003/0015965 A1* 1/2003  Godyak ............ H01J 37/32009
                                                315/111.21
(Continued)

OTHER PUBLICATIONS

Bohnhorst et al: "Simulation aided design of a low cost ion mobility spectrometer based on printed circuit boards", International Journal for Ion Mobility Spectrometry, vol. 19, No. 2, pp. 164-174, Jun. 4, 2016.
(Continued)

Primary Examiner — Nicole M Ippolito
(74) Attorney, Agent, or Firm — WCF IP (57) ABSTRACT The invention relates to an ion transport device which is designed to transport ions by means of an electric field. The ion transport device has an ion transport channel in which an ion transport chamber is formed. In order to generate the electric field, the ion transport device has a plurality of field generating electrodes which are arranged one behind the other along the length of the ion transport channel in order to move ions through the ion transport chamber in a transport direction. The invention additionally relates to an ion mobility spectrometer and to a mass spectrometer.

22 Claims, 3 Drawing Sheets (51) Int. Cl.
*H01J 49/06* (2006.01)
*G01N 27/622* (2021.01)

(58) Field of Classification Search
USPC .......................................... 250/281, 282, 283
See application file for complete search history.

(56) References Cited

U.S. PATENT DOCUMENTS

| | | |
|---|---|---|
| 2009/0206250 A1 | 8/2009 | Wollnik |
| 2015/0318156 A1 | 11/2015 | Loyd et al. |
| 2016/0305909 A1* | 10/2016 | Zimmermann ....... H01J 49/061 |
| 2017/0236698 A1 | 8/2017 | Zhang et al. |
| 2017/0350860 A1 | 12/2017 | Rather et al. |
| 2019/0013184 A1* | 1/2019 | Cui ...................... H01J 37/321 |

OTHER PUBLICATIONS

Eiceman et al: "Planar Drift Tube for Ion Mobility Spectrometry", Instrumentation Science & Technology, vol. 35, No. 4, pp. 365-383, Jul. 2, 2007.

\* cited by examiner

ION TRANSPORT DEVICE, ION MOBILITY SPECTROMETER, AND MASS SPECTROMETER

The invention relates to an ion transport device that is designed to transport ions by means of an electrical field, wherein the ion transport apparatus comprises an ion transport channel in which an ion transport chamber is formed, wherein the ion transport apparatus comprises a plurality of field-generating electrodes to generate the electrical field, arranged one after another along the longitudinal extent of the ion transport channel, in order to move ions in a transport direction through the ion transport chamber. The invention relates moreover to an ion mobility spectrometer and a mass spectrometer.

Ion mobility spectrometers (IMS) are devices for the fast, sensitive analysis of trace gases; they separate ions from one another as a result of their movement through a neutral drift gas under the influence of an electrical drift field. This separation of the ions takes place in what is known as the drift tube of the IMS, in which the drift field is generated through appropriate electrodes. For the sake of a defined environment, the drift tube can be flushed by a drift gas and hermetically sealed against the environment in order to prevent the ingress of contamination from the surroundings. The electrical potential of the individual drift electrodes that serve to generate the drift field can, for example, be set by a resistive voltage divider. The drift tube, which defines the drift chamber, is accordingly one of the primary components of an ion mobility spectrometer, in addition to the ionization chamber or reaction chamber and the detector.

At the inlet of a mass spectrometer (MS) similar requirements are in part present, i.e. ions are also intended to be transported there through a chamber by electrical field. An ion transport apparatus, which in the case of an IMS can form the drift tube and in the case of a mass spectrometer can form the ion funnel, will therefore be referred to in general terms below.

The manufacture of ion mobility spectrometers and mass spectrometers is at present still associated with high technical production costs. The invention is based on the object of providing solutions with which such devices can be manufactured at lower cost.

The object is achieved through an ion transport apparatus of the type mentioned at the beginning, having the following features:
a) the ion transport channel comprises a plurality of side walls formed of flat plates that surround the ion transport chamber,
b) the side walls are formed of electrical circuit boards coated with at least one first conductive layer,
c) the field-generating electrodes are formed as interrupted ring electrodes that surround the periphery of the ion transport chamber, wherein one, a plurality, or all of the ring electrodes are each composed of individual conductive track segments formed on the circuit boards by a part of the first conductive layer, wherein conductive track segments of a ring electrode can contact each other electrically, but do not necessarily have to contact each other electrically,
d) the ion transport apparatus comprises at least one first voltage divider with a plurality of voltage divider connection points and at least one second voltage divider with a plurality of voltage divider connection points,
e) wherein the following applies to one, a plurality or all of the ring electrodes:
  e1) at least one conductive track segment of the ring electrode is connected to a voltage divider connection point of the first voltage divider,
  e1) at least one conductive track segment of the ring electrode other than the conductive track segment that is connected to the voltage divider connection point of the first voltage divider is connected to a voltage divider connection point of the second voltage divider.

The invention has the advantage that the ion transport apparatus can be manufactured with simple, economically obtainable components, namely with standard commercial circuit boards. The side walls in particular of the ion transport channel can here be formed by circuit boards, while in developments to be explained below, further elements of an IMS or an MS can also be formed of circuit boards, so that the total outlay for manufacture is reduced further. The circuit boards can here be manufactured in the usual manner, as is known from circuit boards for electronic circuits, and brought into the desired shape through, for example, milling, etching or other shape-processing methods. The circuit boards can be designed as single-layer or multi-layer circuit boards, i.e. they can have one or a plurality of conductive layers. At least one conductive layer is advantageously present, namely the first conductive layer mentioned previously. This conductive layer is used to form the ring electrodes. It has been discovered that the ring electrodes do not necessarily have to exhibit a circular ring shape, as has been usual up to now. A rectangular, square or other polygonal cross-sectional shape such as can be formed by an assembly of planar boards is equally suitable. The ring electrodes can thus be formed directly by segments of the conductive layers, and no other additional components have to be assembled or soldered on in order to form the ring electrodes.

According to the invention, the ion transport channel is thus constructed of individual (initially separate) electrical circuit boards that form the side walls of the ion transport channel. These individual electrical circuit boards are bonded together at bonding locations. The bonding locations at which the individual circuit boards are jointed together can here be made gas-tight. In one advantageous embodiment of the invention, the individual electrical circuit boards that form the side walls (and, in some cases, also the further parts of the ion transport channel explained below) are formed as rigid circuit boards. This has the advantage that a self-supporting structure that forms the ion transport channel can already be formed by the assembled circuit boards.

Through the circuit board manner of construction of the ion transport apparatus described, drift tubes or ion funnels of compact form can be manufactured, as are needed in particular for hand-held devices. A large number of thin, narrow ring electrodes can moreover be created in a simple manner in order to achieve the necessary homogeneity of the electrical drift field. This can be realized in an easy manner with standard commercial circuit boards. In addition, circuit boards can be fabricated using standard industrial methods, and thus manufactured very economically. Through the circuit board manner of construction according to the invention, ion transport apparatuses for IMS, which are operated with negative pressure and high electrical field strengths, can also be manufactured.

The ion transport apparatus can, for example, comprise the entire region between the ion source and the ion detector, i.e. all those regions through which the ions can be transported, such as the ionization chamber, ion gate, drift chamber and detector region, i.e. the space between the aperture grid (end of the drift tube) and the detector.

The ion transport channel can, for example, be only a part of the ion transport apparatus, for example a segment in the longitudinal direction of the ion transport apparatus, as will be explained below.

Advantageously, the circuit boards used that form the side walls already have connecting points for a first and a second voltage divider, so that the components required to form the voltage divider and necessary for the generation of the uniform electrical field can be contacted easily. In addition, the assembly of the side walls can be simplified in this way, since an electrical contact between all of the conductive track segments of a ring electrode is not necessarily required. Electrical contact between the side walls is accordingly not needed.

The first and/or the second voltage divider can, for example, be designed as a series interconnection of resistors, as a continuous resistive track, or as a combination of these.

The ion transport apparatus can, in principle, have an arbitrary number of side walls in the range from three up without limit. Particularly favorable from the fabrication point of view is the arrangement of four side walls, for example with a square or rectangular cross-section of the ion transport channel. Other numbers of side walls, for example three, five, six, seven, eight can also, however, be advantageous in some specific applications.

The conductive track segments disposed on a circuit board can advantageously be disposed with constant spacings from one another. It is also advantageous if the conductive track segments of a circuit board all have the same widths.

According to one advantageous development of the invention, it is provided that one, a plurality, or all of the side walls comprise at least one second conductive layer of the electrical circuit board running parallel to the first conductive layer. Multilayer circuit boards can accordingly be employed, whereby the functionality that can be realized on the individual circuit boards or the side walls can be increased. The use of multilayer circuit boards moreover offers the possibility of integrating additional electronics directly into the ion transport apparatus. The first conductive layer can be a conductive layer arranged at the surface of the circuit board or in the circuit board material. The second conductive layer can be a conductive layer arranged at the other surface of the circuit board or a conductive layer arranged in the circuit board material.

The second conductive layer, or an additionally provided conductive layer, can moreover form a screen of the arrangement, so that the immunity to interference can be increased.

It is advantageous here if at least on the side at which the first conductive layer is arranged, the circuit board is designed without additional coatings such as solder resist or the like. An unwanted influence on the sensitivity of the ion transport apparatus can be avoided in this way.

According to one advantageous development of the invention, it is provided that the first and/or the second voltage divider is arranged on the second conductive layer. This has the advantage that the components that constitute the first and/or second voltage divider can, so to speak, be arranged locally, i.e. in the place where the ring electrodes are also located, so that unnecessarily long supply lines can be avoided.

According to one advantageous development of the invention, it is provided that the first voltage divider is assigned to a plurality of side walls and/or the second voltage divider is assigned to a plurality of side walls. The number of voltage dividers required can be minimized in this way. The first voltage divider can thereby be assigned to a plurality of side walls of a ring electrode. The second voltage divider can thereby be assigned to a plurality of side walls of a ring electrode. The ion transport apparatus as a whole can, for example, be realized with only two voltage dividers.

According to one advantageous development of the invention, it is provided that the first voltage divider is assigned to a first side wall and/or the second voltage divider to a second side wall. This has the advantage that separate, individual voltage dividers are assigned to each side wall, so that unwanted cross-influences are avoided.

According to one advantageous development of the invention, it is provided that an individual voltage divider is assigned to each side wall formed of a circuit board. The expense of forming the joint between the individual segments of the ring electrode is minimized in this way.

According to one advantageous development of the invention, it is provided that the ion transport apparatus comprises a network of coupling capacitors through which the ring electrodes can be connected to an electrical signal source, wherein one, a plurality or all of the coupling capacitors are formed through parts of conductive layers of one or a plurality of side walls formed of a circuit board. This has the advantage that a funnel for an MS can be manufactured particularly easily and economically. The coupling capacitors required for this application can thus be formed directly through conductive layers of the circuit boards, so that the installation of discrete components can to a large extent be minimized.

According to one advantageous development of the invention, it is provided that the ion transport apparatus comprises at least one heating wire for heating the ion transport channel, wherein the heating wire is formed of parts of conductive layers of one or a plurality of side walls formed of a circuit board. This has the advantage that no separate components are required to form a heating apparatus. The necessary heating wire can rather be embodied directly by parts of conductive layers on one or a plurality of circuit boards. The heating wire can, for example, be formed through a meandering course of a conductive layer on a circuit board or a plurality of circuit boards.

According to one advantageous development of the invention, it is provided that a part or all of the field-generating electrodes are realized on the inner layers of the circuit boards. This has the advantage that the number of field-generating electrodes per unit length can be further increased. In particular, segments of the ring electrodes can in this way be realized through inner layers of the circuit boards. Inner layers of the circuit boards refers here to conductive layers that are not located on the external surfaces, but between the external conductive layers.

According to one advantageous development of the invention, it is provided that the ion transport apparatus comprises an ion detector that is arranged at one end of the ion transport channel, wherein the ion detector is formed by a conductive layer of a circuit board or by an etched metal grid that is both mechanically fixed and electrically contacted by at least one circuit board. This has the advantage that the manufacture of the ion transport apparatus is further simplified, since, for the manufacture of the required ion detector also, no additional complicated components are required. Rather, the ion detector can also be formed by a conductive layer of a circuit board, for example a circuit board that is fastened to the ion transport channel as a closing plate. Alternatively, the ion detector, or optionally one, a plurality or all of the electrodes named below, can be formed as an etched metal grid of this sort. Advantageously, the etched metal grid is both mechanically fixed and electrically contacted by circuit boards.

According to one advantageous development of the invention, it is provided that the ion transport apparatus comprises an ion gate arranged at at least one end of the ion transport channel, wherein at least one electrode of the ion gate is formed by a conductive layer of a circuit board or by an etched metal grid that is both mechanically fixed and electrically contacted by at least one circuit board. This has the advantage that the manufacture of the ion transport apparatus is further simplified, since, for the manufacture of the required ion gate also, no additional complicated components are required. Rather, the ion gate or at least part of it can also be formed by a conductive layer of a circuit board, for example a circuit board that is fastened to the ion transport channel as a closing plate.

According to one advantageous development of the invention it is provided that at least one of the circuit boards comprises at least one groove-like recess into which at least one other circuit board is inserted with positive lock. This has the advantage hat the ion transport apparatus can particularly easily be assembled from the individual circuit boards, since means of forming a positive-lock joint are provided by the groove-like recess, which simplifies the assembly of the components and their fastening to one another.

The individual circuit boards from which the ion transport apparatus is assembled can be bonded to one another using, for example, glue or solder in a force-locked, positive-locked or friction-locked manner. In the case of mechanical bonding using solder, parts of conductive layers can, for example, be used in order to form fastening points.

According to one advantageous development of the invention, it is provided that the ring electrodes formed by conductive track segments are configured as polygonal ring electrodes, the number of whose corners corresponds to the number of the side walls. Usual ring electrodes of IMS or MS devices are designed as closed, circular, electrically conductive structures. Such electrode structures are, however, difficult to manufacture with circuit boards. The construction proposed here divides each ring electrode into a plurality of segments that are located flat on the circuit boards, since they also simultaneously form the walls of the ion transport channel. The segments of all the ring electrodes can in this way each be placed on one circuit board, which enormously reduces the expense of manufacture. Depending on the arrangement and number of circuit boards, different shapes of ring electrode arise, such as triangular, quadrangular, in particular rectangular or square, or polygonal ring electrodes. It has been found that the performance of an IMS or MS does not deteriorate if the ring electrodes are given such a form.

According to an advantageous development of the invention, it is provided that the ratio of the width to the height (which is the thickness of the conductive layer) of a conductive track segment of a ring electrode is greater than 1, in particular greater than 5. A high efficiency of the ring electrodes in forming a homogeneous electrical field can be realized through this. In addition, only small unwanted capacitances are generated by the conductive track segments.

According to an advantageous development of the invention, it is provided that the ratio of the width to the lateral spacing of neighboring conductive track segments of neighboring ring electrodes is greater than 0.5, in particular greater than 1 or greater than 3. A high efficiency of the ring electrodes in forming a homogeneous electrical field can be realized through this.

According to an advantageous development of the invention, it is provided that the ion transport apparatus is segmented into segments in the transport direction. Through the segments, which can also be referred to as longitudinal segments, a modular structure of the ion transport apparatus in the longitudinal direction can, for example, be realized. A segment of the ion transport apparatus can, for example, be the drift tube, and a further segment can be the reaction chamber. One, a plurality, or all of the segments, in particular the drift tube, can each be formed by the ion transport channel constructed in the circuit board construction manner according to the invention.

According to an advantageous development of the invention it is provided that one, a plurality or all of the segments of the ion transport apparatus are each closed off by at least one closing plate that is arranged perpendicularly to the transport direction and that is constructed as a circuit board. On the one hand, a gas-tight closure at the end of the segment can be realized through such closing plates. Yet other functionalities can in addition be realized through such closing plates such as, for example, an ion gate and/or an ion detector.

The closing plates can thus form the interface between the drift chamber and one of the above-mentioned segments, i.e. an ion gate, ionization chamber or reaction chamber, detector or another drift chamber can follow a closing plate. The same applies to the other segments. The closing plates can thus, for example, represent a change between horizontal and vertical alignment of the circuit boards.

According to one advantageous development of the invention it is provided that one, a plurality or all of the closing plates protrude in the circumferential direction above at least one of the side walls. Fastening the side walls to the closing plates is simplified in this way. An annular groove can, for example, be arranged in a closing plate, which groove corresponds to the cross-sectional shape of the arrangement of the side walls of the ion transport channel. The ion transport channel can then be pushed into this groove and fastened there. This permits a simple, positive-lock fastening of the ion transport channel to a closing plate, wherein high stability and good sealing can be realized.

According to one advantageous development of the invention, it is provided that at least one electrode, formed by a conductive layer of a circuit board or by an etched metal grid that is both mechanically fixed and electrically contacted by at least one circuit board, is arranged between neighboring segments of the ion transport apparatus. Such an electrode can, for example, be the electrode of an ion gate. An ion gate with two grid electrodes can, for example, be formed, in that, for example, a circuit board coated on both sides with conductive layers is employed, wherein the conductive layers can form the grid electrodes. Two etched metal grids that are both mechanically fixed as well as electrically contacted by a circuit board can also be used.

According to an advantageous development of the invention it is provided that the side walls surround the ion transport chamber in a gas-tight manner. In this way, the necessary hermetic sealing of an IMS can already be realized by the side walls. Alternatively it is possible not to hermetically seal the side walls and instead to arrange the ion transport apparatus, or the IMS that is fitted with it, or the ion funnel in a gas-tight housing.

The object stated at the beginning is also achieved by an ion mobility spectrometer with an ion transport apparatus of the type previously explained. The ion transport channel can here form the drift tube of the ion mobility spectrometer. The ion transport channel can also form the reaction chamber or one of the above-mentioned segments of the ion mobility spectrometer. The advantages described previously can also be realized in this way.

The object stated at the beginning is also achieved by a mass spectrometer with an ion transport apparatus of the type previously explained. The ion transport channel can here form the ion funnel of the mass spectrometer. The advantages described previously can also be realized in this way.

The invention is described in more detail below with reference to exemplary embodiments and making use of drawings.

Here.

Figure 1:
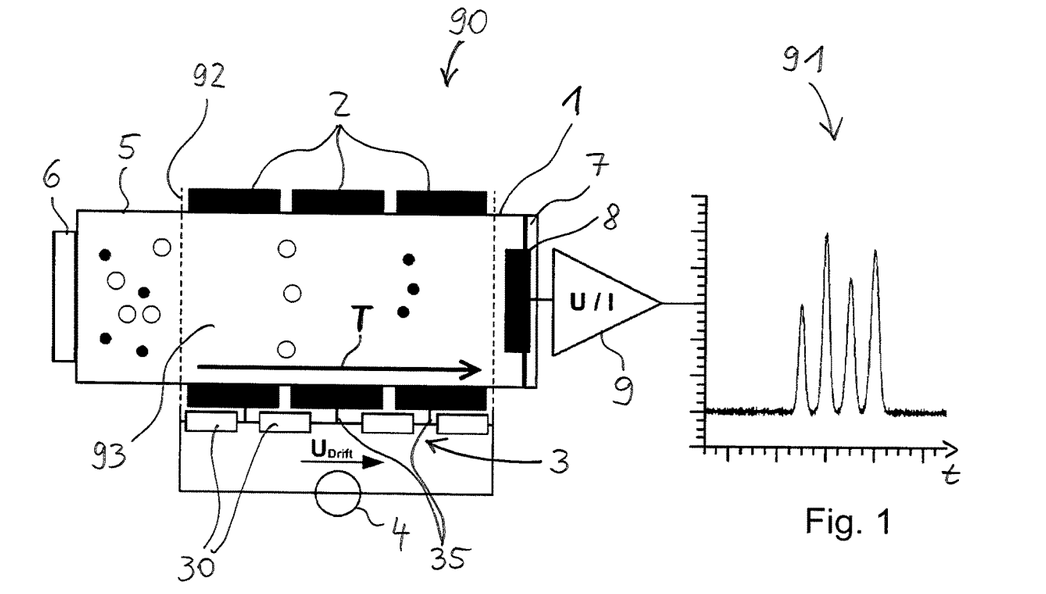
FIG. 1 shows an ion mobility spectrometer.

FIG. 1 shows a highly simplified schematic illustration of an IMS 90. The IMS 90 comprises an ion transport channel 1 which, in an IMS, is also referred to as the drift tube. Inside the ion transport channel 1 there is an ion transport chamber 93 through which ions can be moved in a transport direction T from an ion preparation chamber 5 to an ion detector 8. To generate the ion movement, the ion transport channel 1 comprises field-generating electrodes 2 in the form of ring electrodes that are arranged one after another in the transport direction T. The field-generating electrodes 2 are connected to an electrical energy source 4 via a voltage divider 3. The voltage divider 3 can, for example, be formed of a series interconnection of resistors 30. A homogeneous electrical field is generated in the transport direction T in the ion transport chamber 93 by this arrangement.

The ions can be provided in the ion preparation chamber 5 by, for example, an ion source 6, for example a radioactive source. All the ions generated in the ion preparation chamber 5 are initially still arbitrarily mixed with one another. When a measuring cycle of the IMS 90 is started, then through the appropriate switching of an ion gate 92, ions are introduced from the ion preparation chamber 5 into the ion transport chamber 93. Due to their different mobilities, the different ion species then separate from one another on their path through the ion transport chamber 93, so that different ion species arrive at the ion detector 8 at different times. The ion detector 8 which can, for example, be arranged at a closing plate 7, sends electrical signals to an amplifier 9 in a manner dependent on the arrival of the ions. The amplified signals are represented in a diagram 91 as an ion mobility spectrum. Time is plotted on the abscissa.

The further explanations now concern the question of how an ion transport channel 1, or an ion transport apparatus formed with it, can be manufactured particularly economically.

Figure 2:
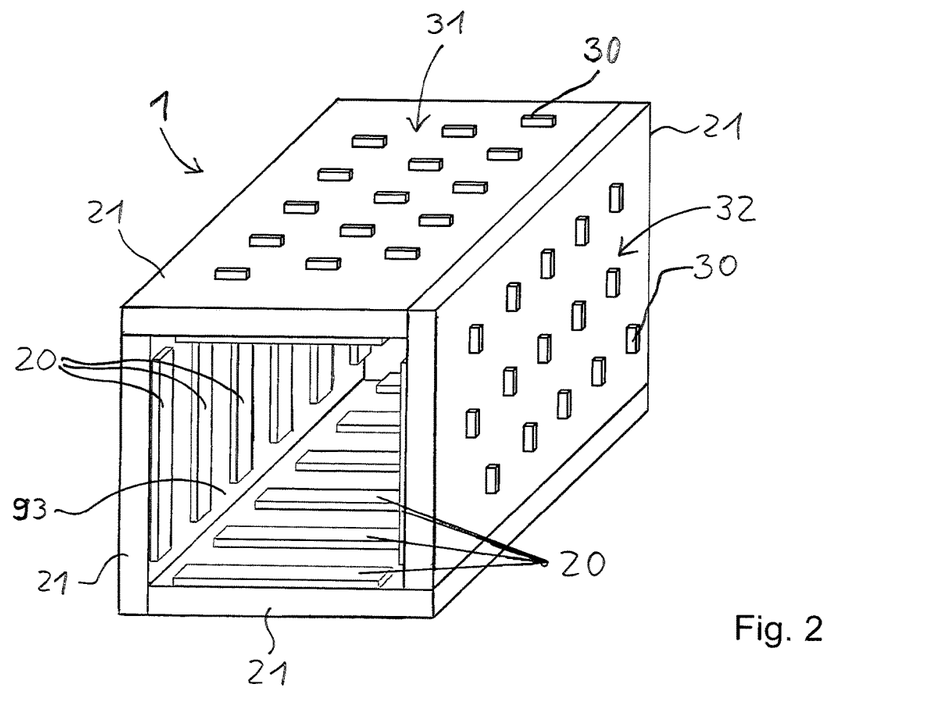
FIG. 2 shows a perspective view of an ion transport apparatus.

FIG. 2 shows an ion transport channel 1 constructed of circuit boards 21. In this case, four circuit boards 21 form the side walls of the ion transport channel 1. The circuit boards are coated with a first conductive layer on the inside of the ion transport channel 1. Conductive track segments 20 that are arranged one after another in the ion transport direction T are formed from the first conductive layer on each circuit board 21. The individual conductive track segments 20 are connected to voltage divider connection points of the respective circuit board 21, for example in that through-contacts to the opposite side of the circuit board are present. Resistors 30 that constitute a first voltage divider 31 and a second voltage divider 32 are disposed on the opposite side of the circuit board, i.e. on the outside of the ion transport channel 1.

As can be seen in FIG. 2, the individual conductive track segments 20 that are to form a ring electrode do not touch each other and are accordingly not electrically connected to one another. In this case it would be necessary to arrange an appropriate voltage divider on the outer side of each circuit board 21. It will be explained below that fewer voltage dividers can also be employed in certain forms of embodiment, for example only the first and second voltage dividers 31, 32, as illustrated in FIG. 2.

Figure 3:
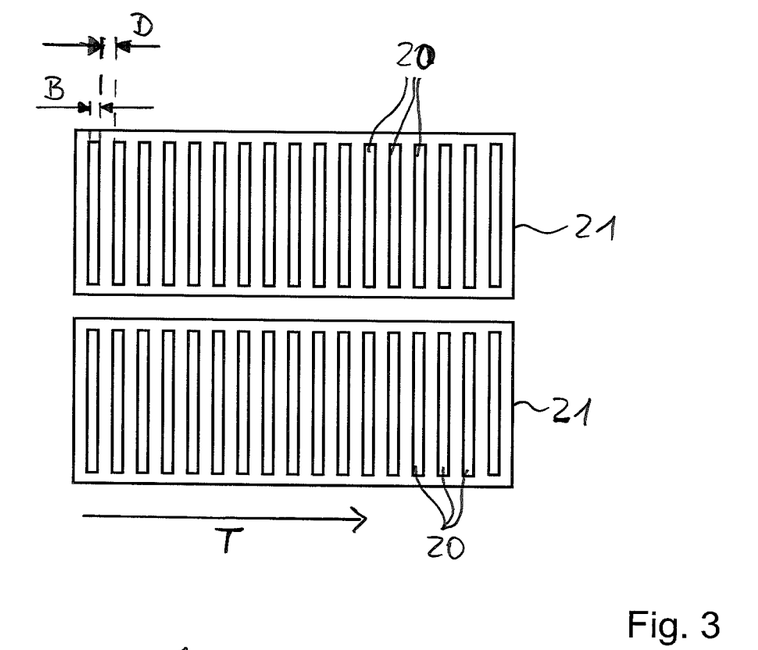
FIG. 3 shows a plan view of two side walls of the ion transport apparatus according to FIG. 2.

FIG. 3 shows a plan view of the inside of two side walls 21, i.e. the side of the circuit boards 21 on which the conductive track segments 20 are arranged. As can be seen, the conductive track segments 20 are formed as narrow conductive strips that are arranged at equal distances, parallel to one another and one after another as seen in the transport direction T. A conductive track segment 20 here has a width B. The lateral spacing between neighboring conductive track segments of neighboring ring electrodes has the dimension D. It is advantageous here if B/D is greater than 0.5, or greater than 1, or greater than 3.

Figure 4:
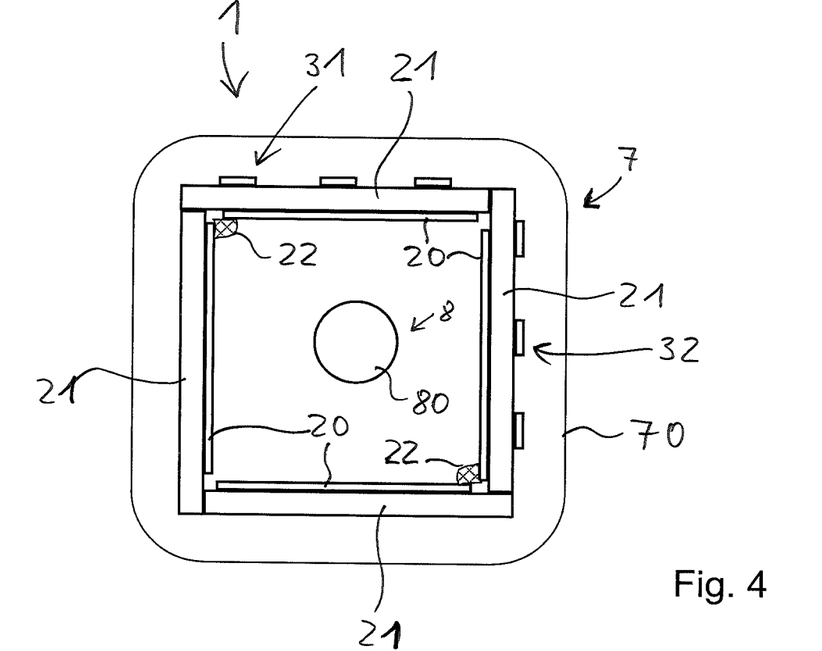
FIG. 4 shows an ion transport apparatus viewed in the transport direction.

FIG. 4 shows an ion transport apparatus that comprises an ion transport channel 1 according to the form of embodiment of FIG. 2. A closing plate 7 is in addition present at one end of the ion transport channel 1, and can also be designed as a circuit board. A conductive layer 80 of this circuit board 70 can then form the ion detector 8.

FIG. 4 also shows that a respective electrical connection between two conductive track segments 20 of the same ring electrode arranged over a corner can be established through electrical bridges 22. An electrical contact between two conductive track segments is furthermore also possible outside the ion transport channel. In this way, for example, the first voltages divider 31 can be assigned to the upper and left-hand circuit boards 21, and the second voltage divider 32 can be assigned to the right-hand and lower circuit boards 21. The electrical connections can, for example, be formed by solder joints 22.

Figure 5:
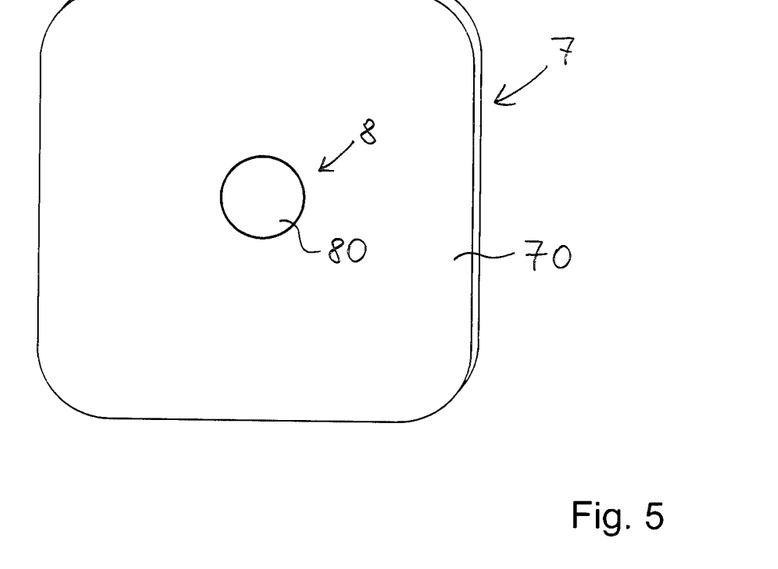
FIG. 5 shows a perspective view of a closing plate.

FIG. 5 again shows the circuit board 70 with the conductive layer 80, shown as a single part. The conductive layer 80 can form the ion detector 8. The circuit board 70 forms the closing plate 7.

Figure 6:
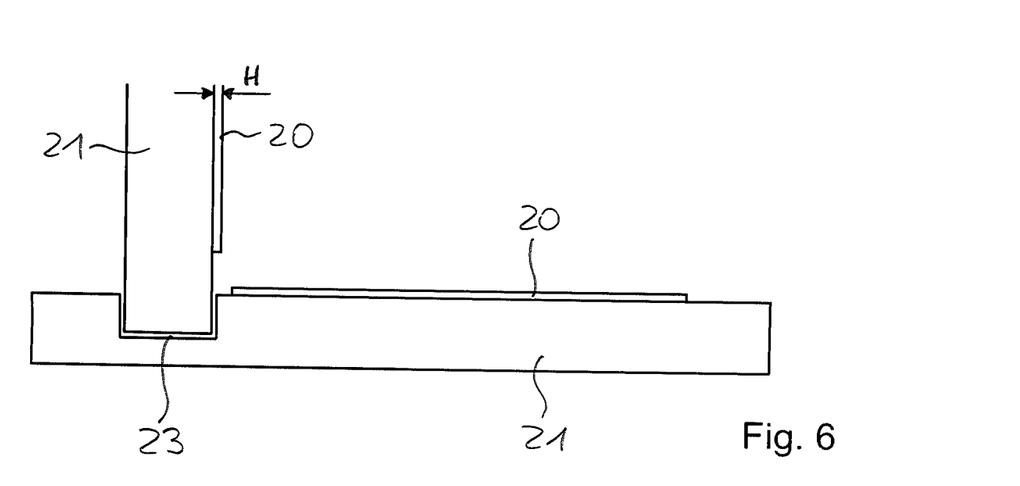
FIG. 6 shows an enlarged cross-sectional illustration of the connection between two side walls.

FIG. 6 shows an advantageous mechanical connection between two circuit boards 21 arranged at an angle with respect to one another, each of which form side walls of the ion transport channel 1. A groove 23 can thus be formed in one circuit board 21. An end edge of another circuit board 21 is inserted into this groove 23. This bonding location can, for example, be additionally fixed by adhesive. In this way, all the side walls of the ion transport channel 1 can be connected to one another.

FIG. 6 also shows the dimension H that defines the height of the conductive layer that forms a conductive track segment 20 (thickness of the conductive layer). It is advantageous if B/H is greater than 1, in particular greater than 5.

The invention claimed is:

1. An ion transport apparatus designed to transport ions by an electrical field, comprising:

an ion transport channel in which an ion transport chamber is formed, wherein the ion transport channel comprises
a plurality of field-generating electrodes to generate the electrical field, wherein the plurality of field-generating electrodes are arranged one after another along a longitudinal extent of the ion transport channel, in order to move ions in a transport direction through the ion transport chamber, wherein:
a) the ion transport channel comprises a plurality of side walls formed of flat plates that surround the ion transport chamber,
b) the plurality of side walls are formed of electrical circuit boards coated with at least one first conductive layer,
c) each of the plurality of field-generating electrodes are formed as discontinuous ring electrodes that surround a periphery of the ion transport chamber, wherein one, a plurality, or all of the discontinuous ring electrodes are each composed of individual conductive track segments formed on the electrical circuit boards by a part of the at least one first conductive layer, wherein conductive track segments of each discontinuous ring electrode of the discontinuous ring electrodes may contact each other electrically, but do not have to contact each other electrically,
d) the ion transport apparatus comprises at least one first voltage divider with a plurality of voltage divider connection points and at least one second voltage divider with a plurality of voltage divider connection points,
e) wherein the following applies to one, a plurality or all of the discontinuous ring electrodes:
  e1) at least one conductive track segment of the ring electrode is connected to a voltage divider connection point of the plurality of voltage divider connection points of the at least one first voltage divider,
  e2) at least one conductive track segment of the discontinuous ring electrode other than the conductive track segment that is connected to the voltage divider connection point of the plurality of voltage divider connection points of the at least one first voltage divider is connected to a voltage divider connection point of the plurality of voltage divider connection points of the at least one second voltage divider.

2. An ion transport apparatus as claimed in claim 1, wherein one, a plurality, or all of the side walls comprise at least one second conductive layer of the electrical circuit board running parallel to the at least one first conductive layer.

3. The ion transport apparatus as claimed in claim 2, wherein the at least one first voltage divider and/or the at least one second voltage divider is arranged on the at least one second conductive layer.

4. The ion transport apparatus as claimed in claim h wherein the at least one first voltage divider is assigned to a plurality of side walls and/or the at least one second voltage divider is assigned to a plurality of side walls.

5. The ion transport apparatus as claimed in claim h wherein the at least one first voltage divider is assigned to a first side wall and/or the at least one second voltage divider is assigned to a second side wall.

6. The ion transport apparatus as claimed in claim h wherein the at least one first voltage divider and the at least one second voltage divider are each assigned to each side wall formed of a circuit board of the electrical circuit boards.

7. The ion transport apparatus as claimed in claim 1, further comprising a network of coupling capacitors through which the discontinuous ring electrodes are connected to an electrical signal source, wherein one, a plurality or all of the coupling capacitors are formed through parts of conductive layers of one or a plurality of side walls formed of a circuit board of the electrical circuit boards.

8. The ion transport apparatus as claimed in claim 1, further comprising at least one heating wire for heating the ion transport channel, wherein the heating wire is formed of parts of conductive layers of one or a plurality of side walls formed of a circuit board of the electrical circuit boards.

9. The ion transport apparatus as claimed in claim h wherein a part or all of the field-generating electrodes are realized on inner layers of the electrical circuit boards.

10. The ion transport apparatus as claimed in claim h further comprising an ion detector arranged at one end of the ion transport channel, wherein the ion detector is formed by a conductive layer of at least one circuit board of the electrical circuit boards or by an etched metal grid that is both mechanically fixed and electrically contacted by the at least one circuit board.

11. The ion transport apparatus as claimed in claim h further comprising an ion gate arranged at at least one end of the ion transport channel or of the ion transport chamber, wherein at least one electrode of the ion gate is formed by a conductive layer of at least one circuit board of the electrical circuit boards or by an etched metal grid that is both mechanically fixed and electrically contacted by the at least one circuit board.

12. The ion transport apparatus as claimed in claim h wherein at least one of the electrical circuit boards comprises at least one groove-like recess into which at least one other circuit board of the electrical circuit boards is inserted with positive lock.

13. The ion transport apparatus as claimed in claim h wherein the discontinuous ring electrodes formed by conductive track segments are configured as polygonal ring electrodes, wherein a number of corners of the polygonal ring electrodes corresponds to a number of side walls of the plurality of side walls.

14. The ion transport apparatus as claimed in claim h wherein a ratio of width to height of a conductive track segment of a ring electrode of the discontinuous ring electrodes is greater than 1.

15. The ion transport apparatus as claimed in claim h wherein a ratio of width to lateral spacing of neighboring conductive track segments of neighboring discontinuous ring electrodes is greater than 0.5.

16. The ion transport apparatus as claimed in claim h wherein the ion transport apparatus is segmented into segments in the transport direction.

17. The ion transport apparatus as claimed in claim 16, wherein one, a plurality or all of the segments of the ion transport apparatus are each closed off by at least one closing plate arranged perpendicularly to the transport direction and that is constructed as a circuit board of the electrical circuit boards.

18. The ion transport apparatus as claimed in claim 17, wherein one, a plurality or all of the closing plates protrude in a circumferential direction above at least one of the side walls.

19. The ion transport apparatus as claimed in claim 1, wherein at least one electrode, formed by a conductive layer of at least one circuit board or by an etched metal grid that is both mechanically fixed and electrically contacted by the at least one circuit board, is arranged between neighboring segments of the ion transport apparatus.

20. The ion transport apparatus as claimed in claim 1, wherein the side walls surround the ion transport chamber in a gas-tight manner.

21. An ion mobility spectrometer, comprising an ion transport apparatus as claimed in claim 1.

22. An ion funnel, comprising an ion transport apparatus as claimed in claim 1.

\* \* \* \* \*

UNITED STATES PATENT AND TRADEMARK OFFICE
CERTIFICATE OF CORRECTION

| | |
|---|---|
| PATENT NO. | : 11,448,615 B2 |
| APPLICATION NO. | : 16/972182 |
| DATED | : September 20, 2022 |
| INVENTOR(S) | : S. Zimmermann et al. |

It is certified that error appears in the above-identified patent and that said Letters Patent is hereby corrected as shown below:

In the Claims

Beginning in Column 9, and continuing into Column 10, please correct the dependencies of the claims as follows:

4. The ion transport apparatus as claimed in claim 1, wherein...

5. The ion transport apparatus as claimed in claim 1, wherein...

6. The ion transport apparatus as claimed in claim 1, wherein...

9. The ion transport apparatus as claimed in claim 1, wherein...

10. The ion transport apparatus as claimed in claim 1, wherein...

11. The ion transport apparatus as claimed in claim 1, wherein...

12. The ion transport apparatus as claimed in claim 1, wherein...

13. The ion transport apparatus as claimed in claim 1, wherein...

14. The ion transport apparatus as claimed in claim 1, wherein...

15. The ion transport apparatus as claimed in claim 1, wherein...

16. The ion transport apparatus as claimed in claim 1, wherein...

Signed and Sealed this
Third Day of January, 2023

*Katherine Kelly Vidal*

Katherine Kelly Vidal
*Director of the United States Patent and Trademark Office*